(12) United States Patent
Hamilton et al.

(10) Patent No.: US 7,181,144 B1
(45) Date of Patent: Feb. 20, 2007

(54) CIRCUIT DESIGN AND OPTICS SYSTEM FOR INFRARED SIGNAL TRANSCEIVERS

(75) Inventors: T. Allan Hamilton, San Jose, CA (US); Michael R. Watson, San Jose, CA (US)

(73) Assignee: ZiLOG, Inc., San Jose, CA (US)

( * ) Notice: Subject to any disclaimer, the term of this patent is extended or adjusted under 35 U.S.C. 154(b) by 0 days.

(21) Appl. No.: 09/560,224

(22) Filed: Apr. 28, 2000

Related U.S. Application Data

(63) Continuation of application No. 09/285,608, filed on Apr. 2, 1999, now abandoned, which is a continuation-in-part of application No. 09/113,036, filed on Jul. 9, 1998, now Pat. No. 6,281,999.

(51) Int. Cl.
*H04B 10/00* (2006.01)

(52) U.S. Cl. .................. 398/164; 398/128; 398/130

(58) Field of Classification Search ............. 359/152, 359/163, 172, 143; 340/825–72; 398/128–130, 398/135, 164; 257/81, 192; 385/14
See application file for complete search history.

(56) References Cited

U.S. PATENT DOCUMENTS

| | | | | |
|---|---|---|---|---|
| 3,979,587 A | * | 9/1976 | de Cremoux | 257/85 |
| 4,279,465 A | | 7/1981 | Vojvodich | 350/96.2 |
| 4,851,695 A | * | 7/1989 | Stein | 250/551 |
| 4,989,934 A | | 2/1991 | Zavracky et al. | 359/152 |
| 5,122,893 A | | 6/1992 | Tolbert | 359/152 |
| 5,280,184 A | | 1/1994 | Jokerst et al. | 359/163 |
| 5,382,810 A | | 1/1995 | Isaksson | 257/81 |
| 5,384,652 A | | 1/1995 | Allen et al. | 359/172 |

(Continued)

FOREIGN PATENT DOCUMENTS

EP    0876011    11/1998

(Continued)

OTHER PUBLICATIONS

International Search Report, mailed Jul. 24, 2000, Applicant: CALIBRE, Inc., International Appln. No. PCT/US00/08858, 5 pages.

*Primary Examiner*—Dzung Tran
(74) *Attorney, Agent, or Firm*—Imperium Patent Works; Darien K. Wallace; T. Lester Wallace

(57) ABSTRACT

An Improved Circuit Design and Optics System for Infrared Signal Transceivers is disclosed. The preferred system includes an IR transceiver assembly that is easily grasped by assemblers. Furthermore, the primary and secondary lenses associated with the transceiver system are easier to manufacture than current lens designs. Also, the heretofore critical lens separation between the infrared emitting and infrared detection devices and the primary lens is rendered a flexible dimension, dependent only upon the particular appliance in which the system is installed. The present invention permits the stand for infrared emitting and infrared detection devices to be eliminated as a result of exchanging a non-imaging transceiver system with the current imaging transceiver system. The present invention further comprises assembling or otherwise combining infrared emitting and infrared detection devices into a single infrared emitting/infrared detection device stack. Finally, the present invention provides a Ir transceiver assembly that has a smaller footprint by backside mounting and/or stacking the discrete devices.

22 Claims, 13 Drawing Sheets

U.S. PATENT DOCUMENTS

| | | | | |
|---|---|---|---|---|
| 5,506,445 A | * | 4/1996 | Rosenberg | 257/666 |
| 5,563,728 A | * | 10/1996 | Allen et al. | 359/172 |
| 5,585,953 A | | 12/1996 | Zavrel | 359/152 |
| 5,753,928 A | * | 5/1998 | Krause | 250/551 |
| 5,757,277 A | | 5/1998 | Kobayashi | 359/152 |
| 5,781,321 A | * | 7/1998 | Kobayashi | 359/143 |
| 5,903,374 A | | 5/1999 | Kobayashi | 359/152 |
| 6,169,295 B1 | * | 1/2001 | Koo | 257/81 |
| 6,301,035 B1 | * | 10/2001 | Schairer | 398/128 |
| 6,479,844 B2 | * | 11/2002 | Taylor | 257/192 |

FOREIGN PATENT DOCUMENTS

| | | |
|---|---|---|
| GB | 1466486 | 3/1997 |
| GB | 2326786 | 12/1998 |
| WO | 9956417 | 11/1999 |
| WO | 9962121 | 12/1999 |

* cited by examiner

US 7,181,144 B1

CIRCUIT DESIGN AND OPTICS SYSTEM FOR INFRARED SIGNAL TRANSCEIVERS

CROSS REFERENCE TO RELATED APPLICATION

This application is a continuation of, and claims priority under 35 U.S.C. §120 from, nonprovisional U.S. patent application Ser. No. 09/285,608, filed on Apr. 2, 1999, now abandoned, the subject matter of which is incorporated herein by reference. Application Ser. No. 09/285,608 is a continuation-in-part of, and claims priority under 35 U.S.C. §120 from, nonprovisional U.S. patent application Ser. No. 09/113,036 filed on Jul. 9, 1998, now U.S. Pat. No. 6,281,999, the subject matter of which is incorporated herein by reference.

BACKGROUND OF THE INVENTION

1. Field of the Invention

This invention relates generally to infrared communications systems and, more specifically, to an Improved Circuit Design and Optics System for Infrared Signal Transceivers.

2. Description of Related Art

As technology becomes continually more accessible to the "common man," the ability to use, store, transfer and otherwise manipulate information has become the focus of most businesses as well as for the individual consumer. Access to the information resources is commonly by some sort of network system, including World Wide Web, "Intranets", local area networks, wide area networks, as well as corporate databases.

While the conventional method for connecting to one of these information networks has been via cable and wire, as the reliance upon connectivity to information has deepened, the desire to gain such access from mobile or portable devices has strengthened. These portable devices, such as Personal Digital Assistants, handheld computers, and even cellular telephones are now being connected to each other and to networks via Infrared Data Communications. In fact, it is virtually impossible to purchase a notebook computer today that does not include an Infrared Data Communications assembly resident within it.

FIG. 1 depicts the typical infrared data communications hardware that is installed in electronic devices; it is a perspective view of a prior infrared transceiver assembly 10. As discussed above, these assemblies 10 are found in virtually every notebook computer sold today. The components of the assembly 10 are virtually identical across all manufacturers' product lines, with few exceptions. The typical assembly 10 comprises a housing 12 within which the infrared emitting device and infrared detection device (see FIG. 2) are mounted. The "transceiver" is actually data processing circuitry for managing the infrared emitting device and infrared detection device; its location is therefore not optically-dependent (and, in fact, it operates better in "IR darkness"). The housing 12 usually is molded from plastic, with a primary lens unit 14 formed in one of the sides of the housing 12. As can be seen, the conventional primary lens unit 14 comprises two lenses; one each for the infrared emitting device and infrared detection device (both lenses with similar optical properties, and both requiring precision and reproducibility). Adjacent to the housing 12, is a protective lens 16. The protective lens 16 is generally constructed from a colored plastic that is transparent to infrared signals. In most cases, the protective lens 16 is attached to the external case of the electronic device, its purpose being to protect the inner workings of the device, while also permitting infrared signals to pass in and out. FIG. 3 gives further detail regarding the workings of the prior assembly 10.

FIG. 2 is a cutaway side view of the prior infrared transceiver assembly 10 of FIG. 1. As can be seen, the housing 12 is generally attached to the "motherboard" 18 or other printed circuit board within the electronic device. Within the housing 12 is located an infrared emitting/infrared detection device pair 20. It should be understood that it is also common to place more than a single infrared emitting device and/or infrared detection device inside of one housing 12 (e.g. two infrared emitting devices and one infrared detection device, etc.); an infrared emitting device and infrared detection device pair 20 is used here simply in the interest of brevity.

The infrared emitting device and infrared detection device pair 20 transmit and receive infrared signals. The infrared emitting device and infrared detection device pair 20 is typically mounted to a stand 22, and thereby positioned in the signal path of the primary lens 14 in order to send and receive infrared signals therethrough. As discussed earlier, the appliance case 24 has an aperture 25 formed therein, and into which a protective lens 16 is installed. The protective lens 16 simply protects the inner workings of the appliance from contamination.

This prior assembly 10 has several deficiencies. First, the protrusion of the primary lens unit 14 can make the housing 12 difficult to grasp by humans and/or machines assembling the electronic devices. The difficulty in grasping can result in manufacturing defects, production delays, and generally higher costs of production. What is needed is a primary lens unit design that does not present a grasping difficulty to assemblers.

Second, the primary lens unit 14 mandates higher manufacturing and design standards than the average plastic housing for an electronic device to insure that the light-refractive traits of the primary lens 14 are predictable and repeatable. Because the primary lens unit 14 is integral to the housing 12, the entire housing 12 becomes subject to the elevated quality standards. It would be much more cost-effective if the design of the integral primary lens unit 14 did not mandate elevated quality standards for the entire housing 12.

Other defects with the prior assembly 10 are illustrated by FIG. 3. FIG. 3 is a cutaway side view of the transceiver assembly 10 of FIGS. 1 and 2, depicting the typical transmit dispersion angle $\theta_T$ of the assembly 10. By current IrDA (Infrared Data Association) standards, the transmit dispersion angle $\theta_T$ must be at least 15 (fifteen) degrees from the focal axis 26 (in two dimensions, of course). The transmit dispersion angle $\theta_T$ is the sum-total of the primary lens refraction angle $\theta_1$ and the protective lens refraction angle $\theta_2$. All prior assemblies 10 include a protective lens 16 that has no refractive power; the protective lens 10 refraction angle $\theta_2$ is, therefore, typically 0 degrees. Consequently, the conventional primary lens unit refraction angle $\theta_1$ is 15 (fifteen) degrees.

There are several design implications resulting from having the entire transmit dispersion angle $\theta_T$ provided by the primary lens unit 14. The infrared emitting device and infrared detection device pair 20 must be located at the focal point 30 of the primary lens unit 14 in order to insure that no signal data is lost. As such, the height 28 (as well as horizontal placement) of the infrared emitting device and infrared detection device pair 20 is very specifically defined. Moreover, the stand (see FIG. 2) must be included in order to raise the infrared emitting device/infrared detection device pair 20 above the printed circuit board 18. It would be a better arrangement if the infrared emitting device/infrared detection device pair 20 could be mounted directly to the printed circuit board 18. Furthermore, the separation 32 between the primary lens unit 14 and the protective lens 16 is very critical. Unless the primary lens unit 14 is very close to the protective lens 16, the protective lens 16 must be relatively large or else the mandated angular dispersion will not be met. A large protective lens 16 can be a serious design constraint for the smaller electronic devices, where component real estate is very tight. What would be better is a design that permits the protective lens 16 to be very small, allows the lens separation distance 32 to be flexible, and still meets the IrDA angular dispersion requirements.

Another problem exists in regard to the conventional design for IF infrared transceiver assemblies. As can be seen from FIG. 9, which depicts the infrared transceiver assembly 10 of FIGS. 1 and 2, the infrared transceiver assembly 10 comprises a housing 12 within which is found a PC board 18. It is understood that the PC board in some cases might be replaced with a lead frame. The PC board generally has a front side 68 and a back side 70; the housing 12 is typically formed with an infrared detection device lens element 14A and an infrared emitting device lens element 14B (which together comprise primary lens element 14 described above in connection with FIG. 1). Mounted on the PC board 18 and in the optical path of the infrared detection device lens element 14A is a conventionally infrared detection device 64. Also mounted on the PC board 18, and in the optical path of the infrared emitting device lens element 14B, is an infrared emitting device 62. Transceiver circuit device 72, which is typically an integrated circuit device comprising hardware which can send and receive signals from the infrared emitting device 62 and the infrared detection device 64, respectively, is also attached to the PC board 18, (geographically located between the infrared detection device 64 and the infrared emitting device 62). For the PC board 18 situation, transceiver circuit device 72, infrared detection device 64 and infrared emitting device 62 are electrically connected to the pc board 18 via connection means 74 which in this case is of the wire bond type conventionally known in the field. A problem with conventional infrared transceiver assemblies 10 is one of real estate. In the package shown in FIG. 9, the requirement for separate footprints for the infrared emitting device 62, the infrared detection device 64 and the transceiver circuit device 72L mandates that the PC board 18 is wide and further mandates that there be a plurality of lens elements. It would be beneficial if this large combination of footprints could be minimized by reducing the device size of the transceiver assembly and potentially the cost, among other advantages.

SUMMARY OF THE INVENTION

In light of the aforementioned problems associated with the prior devices, it is an object of the present invention to provide an improved circuit design and optics system for infrared signal transceivers. It is a further object that the improved system include an infrared transceiver assembly that is easily grasped by assemblers. It is also an object that the primary and secondary lenses associated with the transceiver system be easier to manufacture than current lens designs. It is a still further object that the heretofore critical lens separation between the infrared emitting and infrared detection devices and the primary lens become a flexible dimension, dependent only upon the particular appliance in which the system is installed. It is another object that the stand for infrared emitting and infrared detection devices be eliminated as a result of exchanging a non-imaging transceiver system with the current imaging transceiver system. Finally, it is an object that infrared emitting and infrared detection devices be assembled or otherwise combined into a single infrared emitting/infrared detection device stack. A further object of the present invention is to provide and improved the infrared transceiver assembly that has much smaller outside dimensions than the current state of the art.

BRIEF DESCRIPTION OF THE DRAWINGS

The objects and features of the present invention are set forth with particularity in the appended claims. The present invention, both as to its organization and manner of operation, together with further objects and advantages, may best be understood by reference to the following description, taken in connection with the accompanying drawings, wherein:

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to provide an Improved Optics System for Infrared Signal Transceivers.

Figure 4:
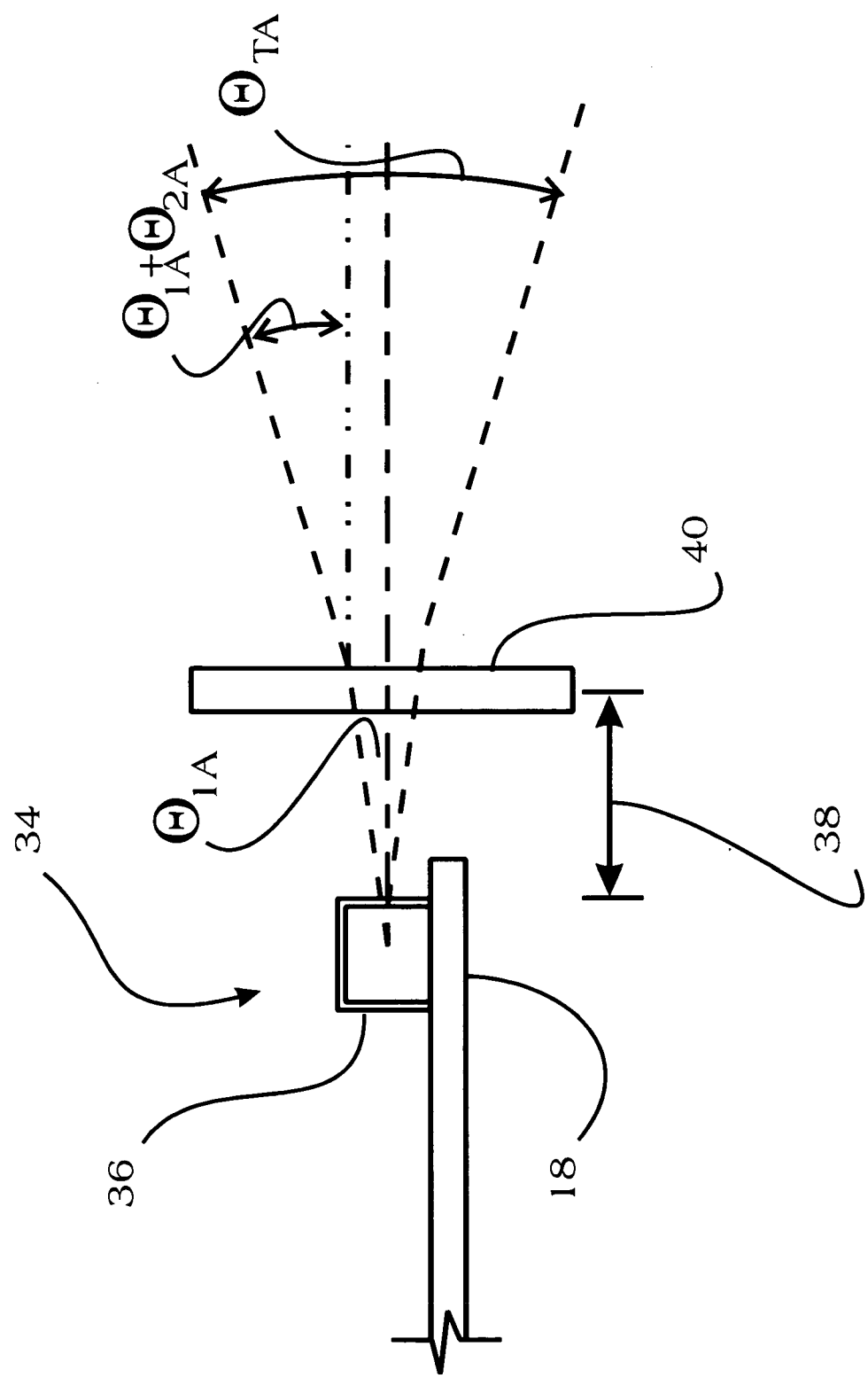
FIG. 4 is a cutaway side view of a preferred embodiment of the improved transceiver assembly of the present invention.

The present invention can best be understood by initial consideration of FIG. 4. FIG. 4 is a cutaway side view of a preferred embodiment of the improved transceiver assembly 34 of the present invention. Similar to the prior assemblies, this improved assembly comprises a housing 36 and a secondary lens 40, which are separated by a distance 38. What is unique about this particular assembly 34 is the optical characteristics of the secondary lens 40. Instead of simply being a protective cover for the electronics, this secondary lens 40 also has refractive characteristics. As such, the transmit dispersion angle $\theta_{TA}$ of this preferred assembly 34 is equal to the primary lens unit refraction angle $\theta_{1A}$ plus the additional secondary lens refraction angle $\theta_{2A}$. In this new arrangement, therefore, a much wider field of transmission is possible, because the transmit dispersion angle OTA can be increased to well beyond the standard fifteen degrees. Furthermore, the secondary lens 40 can be exchangeable with other secondary lenses having different optical characteristics. In this manner, a limitless variety of dispersion angles $\theta_{TA}$ can be achieved for a single piece of equipment.

Figure 5:
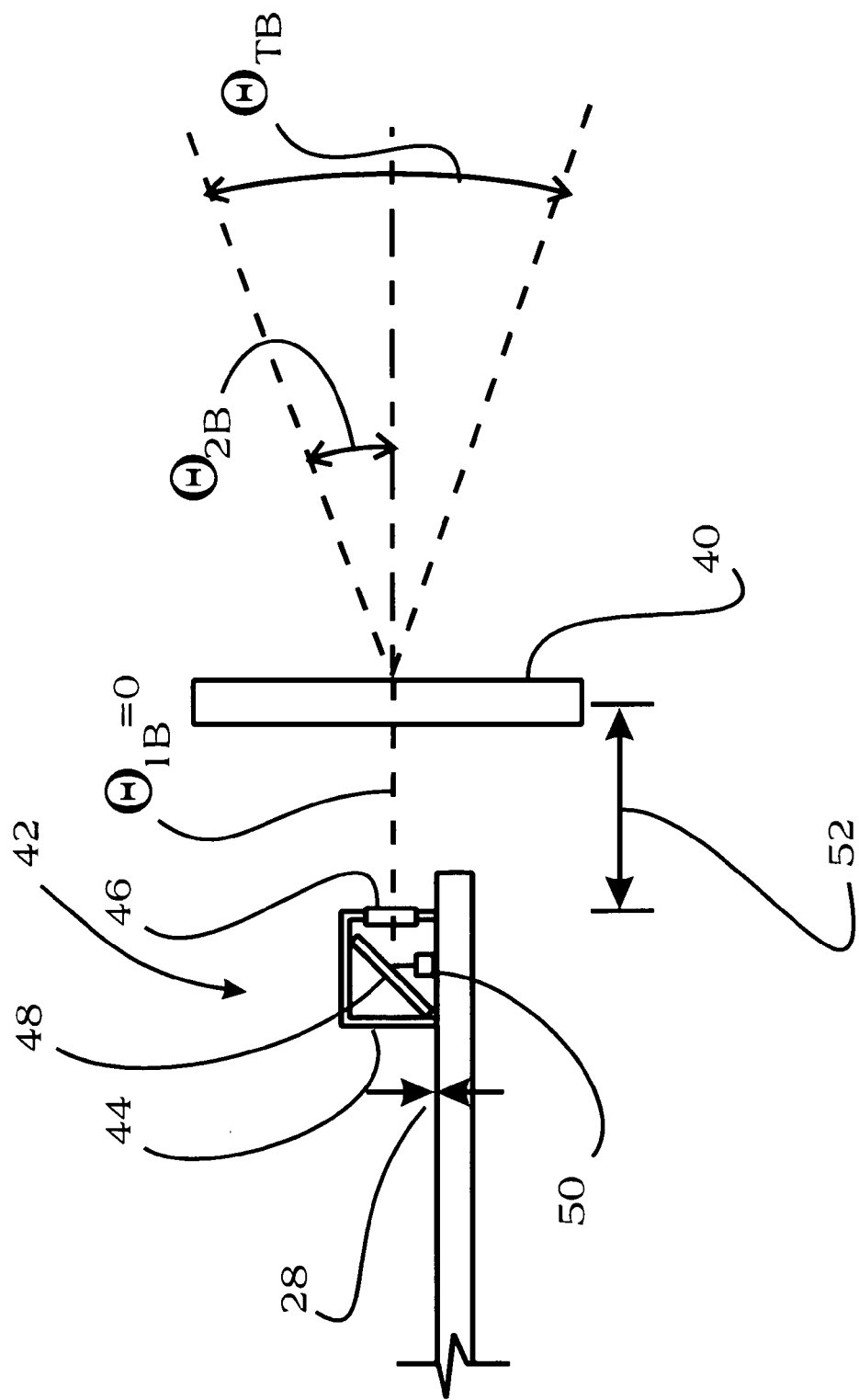
FIG. 5 is a cutaway side view of another preferred embodiment of the improved transceiver assembly of the present invention.

Now turning to FIG. 5, we might further explore the implications and benefits of the new design. FIG. 5 is a cutaway side view of another preferred embodiment of the improved transceiver assembly 42 of the present invention. Similar to the assembly 34 of FIG. 4, this assembly 42 comprises a secondary lens 40 that has refractive power. In this present embodiment, however, the primary lens unit 46 has no refractive power (i.e. $\theta_{1B}$=0 degrees). As such, the entire transmit dispersion angle $\theta_{TB}$ is determined by the contributions from the secondary lens 40; no redirection of the light occurs as it passes through the primary lens unit 46.

Figure 1:
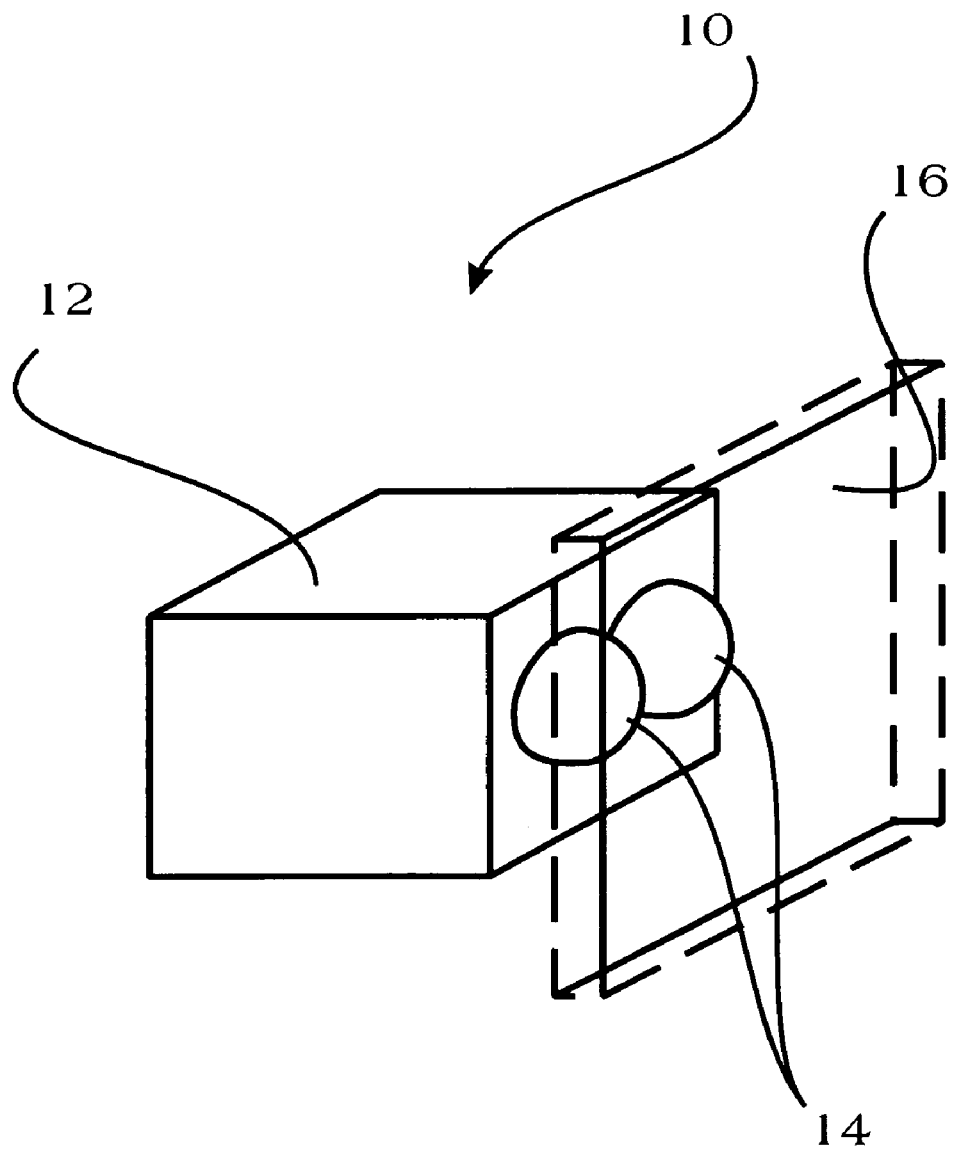
FIG. 1 (prior art) is a perspective view of a prior art infrared transceiver assembly.
Figure 2:
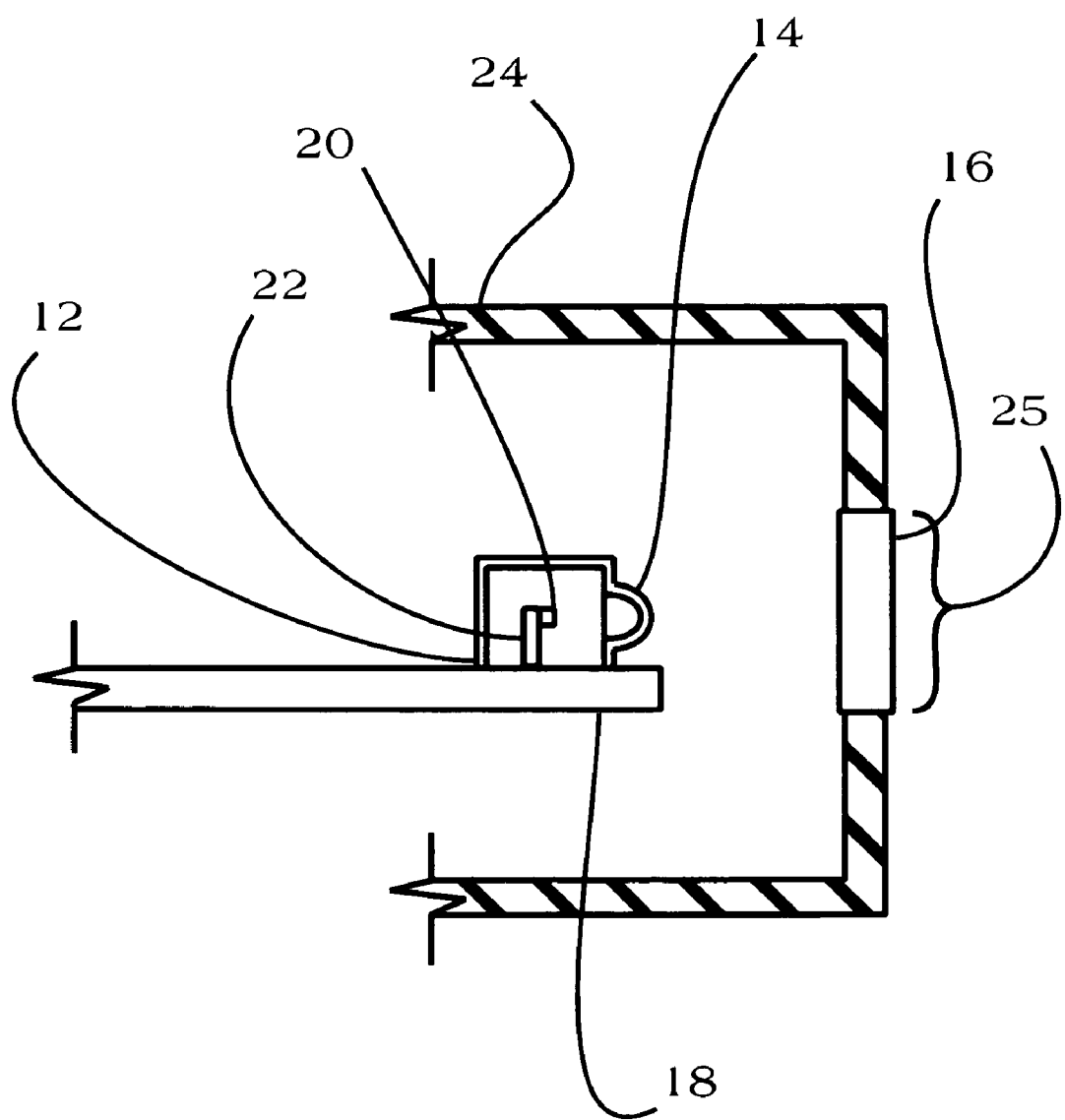
FIG. 2 (prior art) is a cutaway side view of the prior art infrared transceiver assembly of FIG. 1.
Figure 3:
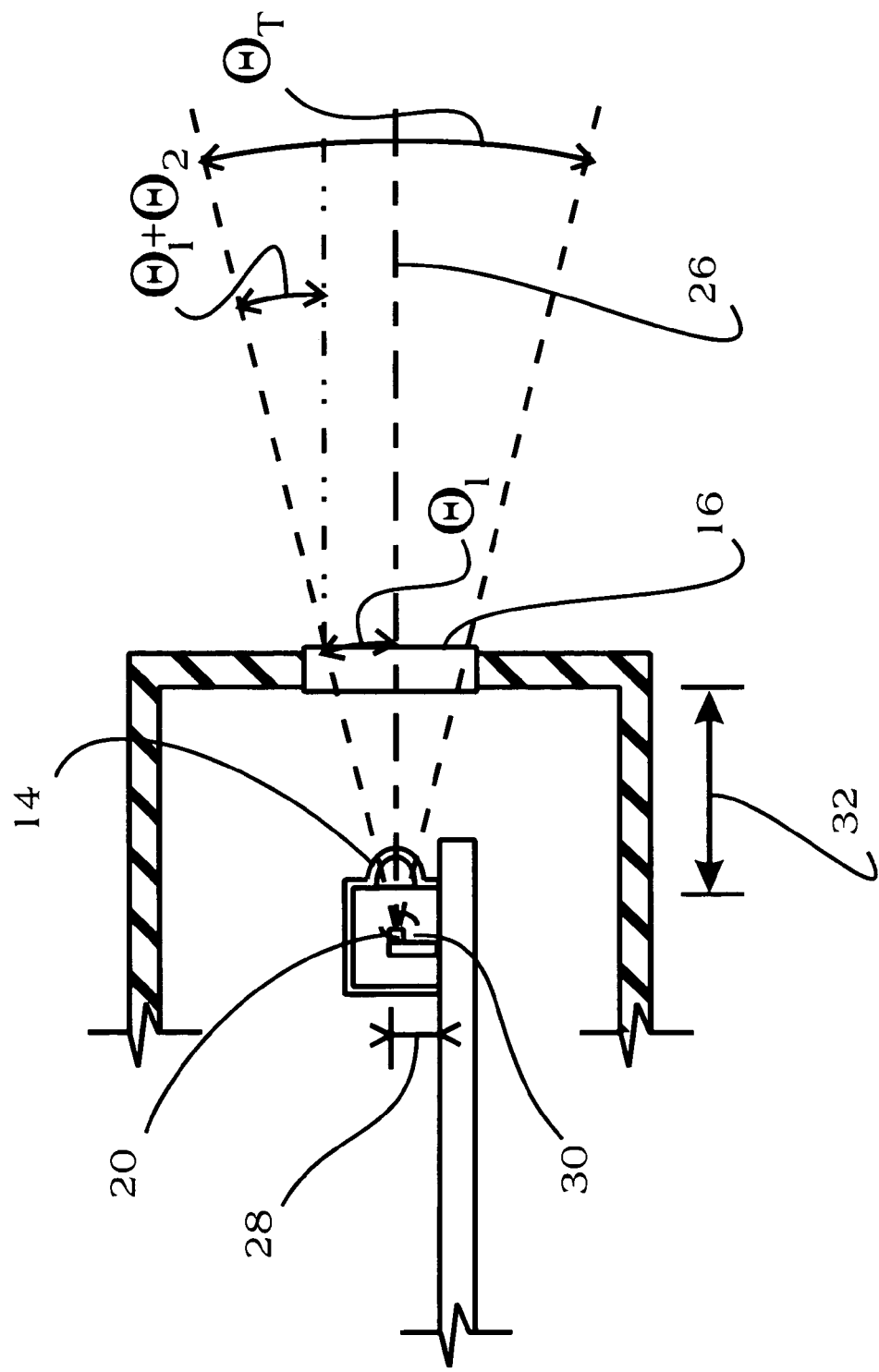
FIG. 3 is a cutaway side view of the transceiver assembly of FIGS. 1 and 2, depicting the typical transmit dispersion angle.

Because there is no redirection of the light by the primary lens unit 46, the lens separation distance 52 ceases to be determined by the size of the aperture (see FIG. 2) and secondary lens 40. This provides a significant advantage over the prior assemblies because the housing 44 can be placed in a location on the PC board that is convenient to the PC board layout, without the concern for its distance from the case (and the secondary lens 40).

Furthermore, there are other benefits to this new design. Since there is no focussing of the light by the primary lens unit 46, there is no focal point for the light. The conventional infrared emitting device/infrared detection device pair 20 can be replaced with "non-imaging" infrared emitting device/infrared detection device pair 50 that is not dependent upon a focal point. "Non-imaging" infrared detection devices simply detect any (and all) incident infrared light—they are commonly less expensive than the "imaging" infrared detection devices in use by conventional IR transceiver assemblies. The incident (and transmitted) light may simply be redirected by a mirror 48 and down to (or out from) the infrared emitting device/infrared detection device pair 50. Because there is no longer a focal point to deal with, the location of the infrared emitting device/infrared detection device pair 50 is very flexible. In fact, it would be natural to mount the infrared emitting device/infrared detection device pair 50 directly onto the PC board, with the infrared emitting device/infrared detection device height 28 being effectively zero. This means that the infrared emitting device/infrared detection device pair 50 can be mounted easily by conventional PC board assembly processes—the housing might actually be added on later. Consequently, the manufacturing costs attributable to the IR transceiver assembly 42 are substantially reduced.

Figure 6:
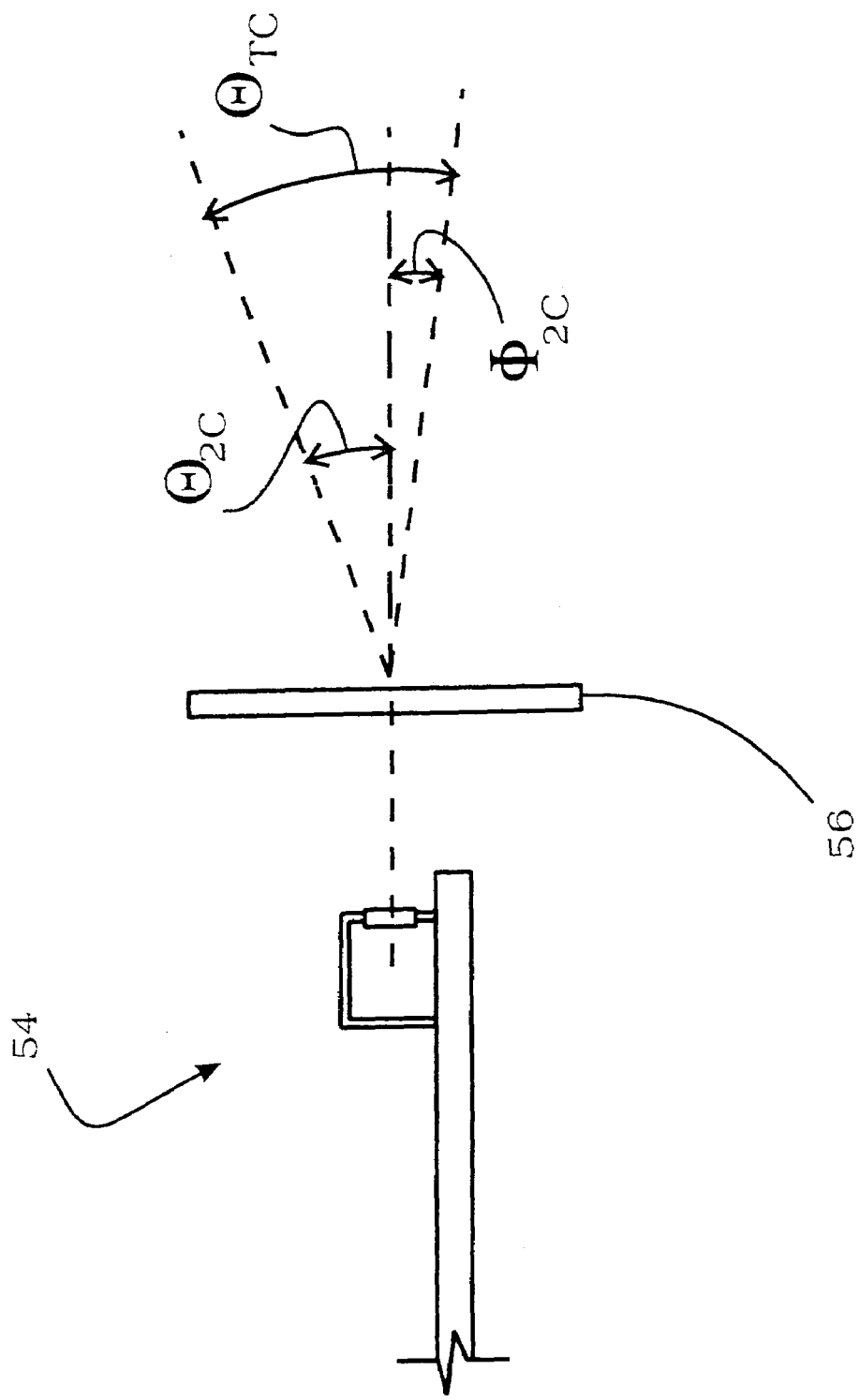
FIG. 6 is a partial cutaway side view of yet another preferred feature of the improved transceiver assembly of the present invention.
Figure 7:
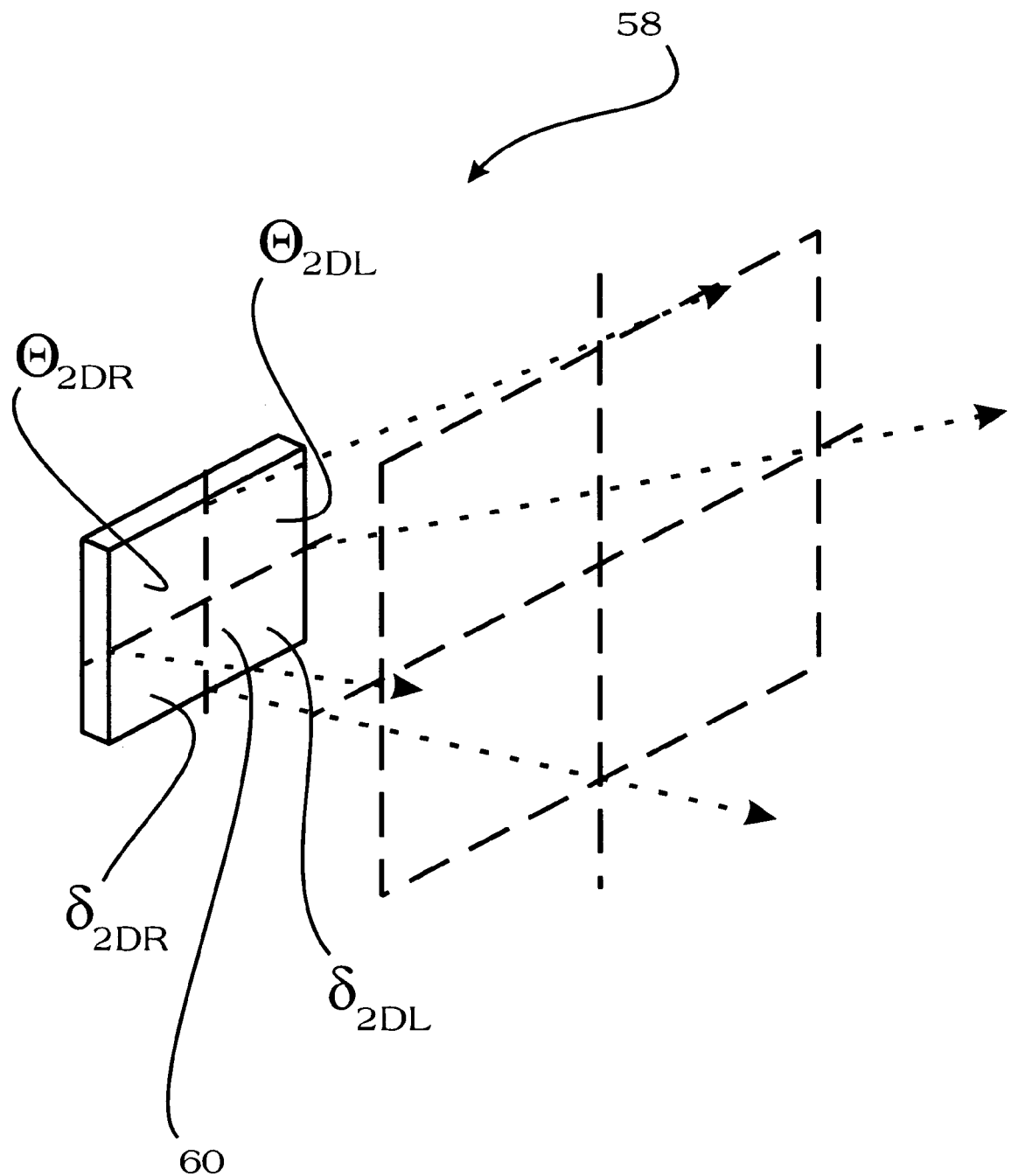
FIG. 7 is a partial perspective view of still another preferred embodiment of the present invention.

In another series of embodiments, there may be different dispersion angles for different regions of the secondary lens 56. An example is provided in FIG. 6, which is a partial cutaway side view of yet another preferred embodiment of the improved transceiver assembly 54 of the present invention. In this Figure, the transmit dispersion angle $\theta_{TC}$ is equal to the total of the secondary lens upper region refraction angle $\theta_{2C}$ and the secondary lens lower region refraction angle $\phi_{2C}$. As can be seen, these two regions have different refracting characteristics. It should be appreciated that a virtually limitless set of combinations of different refracting regions may be desired. FIG. 7 is a partial perspective view of still another preferred embodiment of the infrared transceiver assembly 58 of the present invention. In this embodiment, the secondary lens 60 is divided into four regions, each having unique refractive characteristics, as indicated by the upper left refraction angle $\theta_{2DL}$, the upper right refraction angle $\theta_{2DR}$, the lower left refraction angle $\phi_{2DL}$, and the lower right refraction angle $\phi_{2DR}$. Again, it should be apparent that this is simply one design example; a wide variety of regions and refraction characteristics is expected.

It is also possible that a secondary lens employing shiftable and/or variable refracting regions is currently available, such as via Liquid Crystal technology. Furthermore, the secondary lens might be configured to mask out certain regions by being selectively opaque to infrared signal transmission. Each of these features is a significant advancement over the prior devices.

Figure 8:
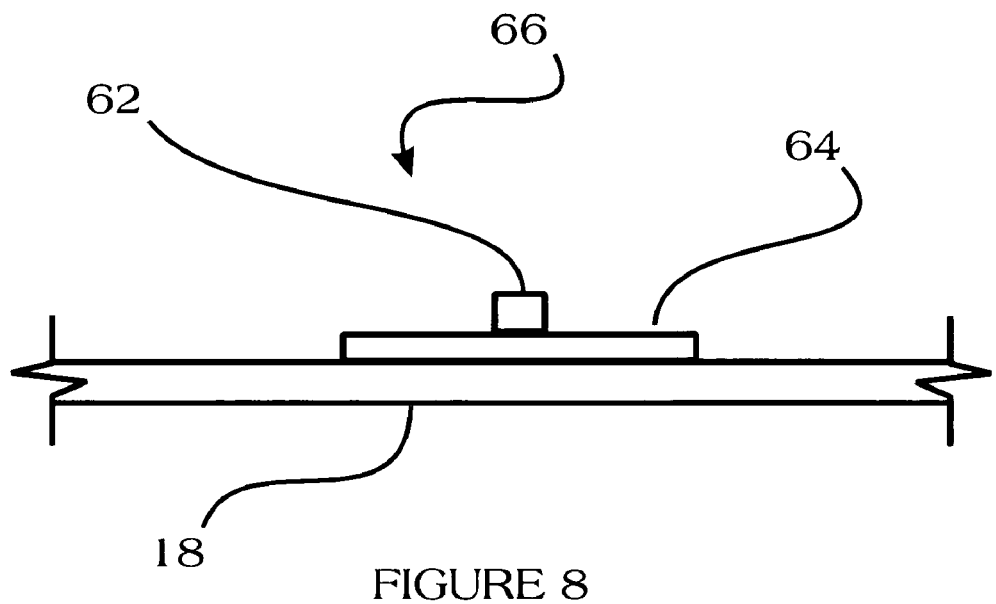
FIG. 8 is a partial cutaway side view of an integrated infrared emitting infrared detection device stack of the present invention.

Another significant advancement of the present invention involves assembling or otherwise combining the infrared emitting device/infrared detection device pair into a single, integrated infrared emitting/infrared detection device stack 66, as depicted by FIG. 8. The infrared emitting device is much smaller than the infrared detection device (0.3 mm$^2$ vs. 1.8 mm conventionally); furthermore, the infrared emitting device circuitry is conventionally built upon a transparent substrate. It is an aspect of the present invention that the infrared emitting device 62 be placed directly on top of the infrared detection device 64 (i.e. in the path of incident and exiting IR signals) to form an integrated infrared emitting/infrared detection device stack 66. This was very difficult under prior transceiver assembly designs, because the infrared emitting device and infrared detection device would most likely have different focal points. Under the improvement described previously herein, however, the focal point of the primary lens unit is no longer an issue.

Figure 9:
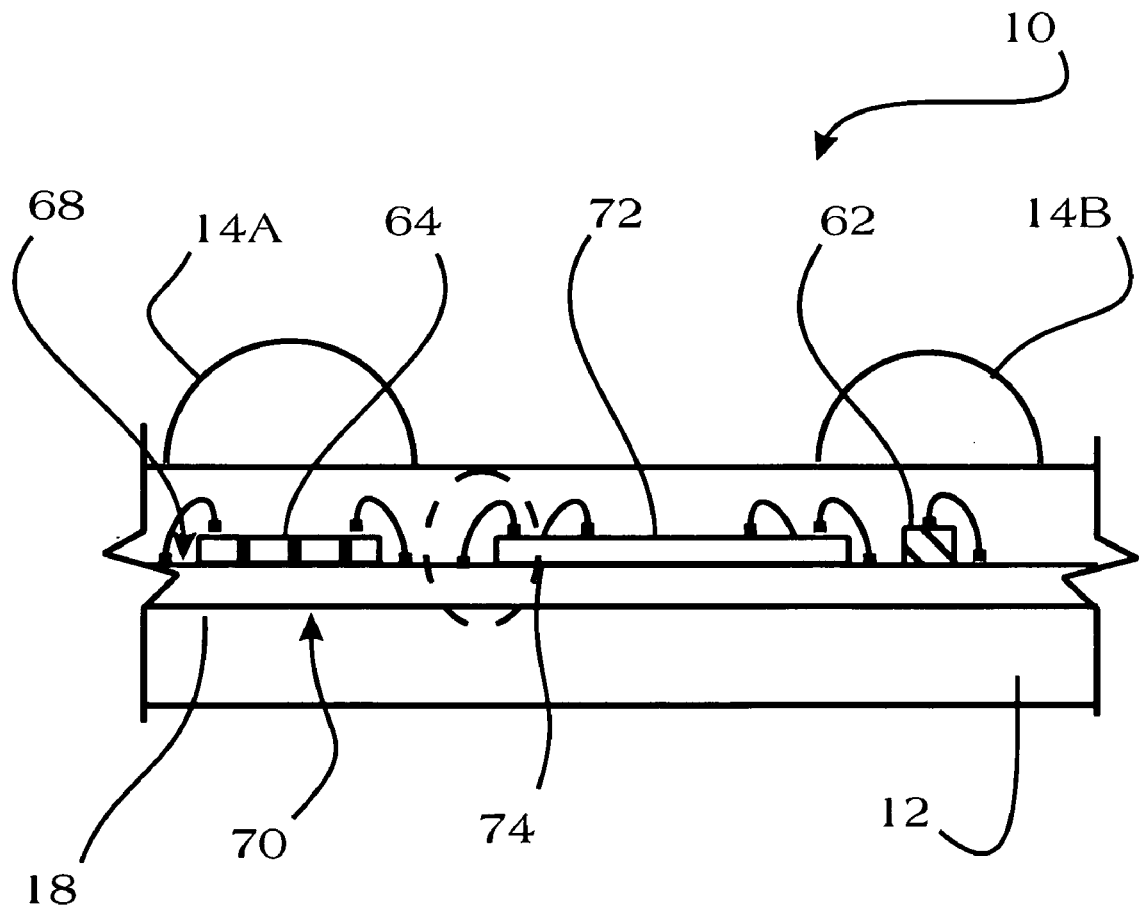
FIG. 9 (prior art) is a cutaway top view of a conventional infrared transceiver assembly depicted in FIG. 1.
Figure 10:
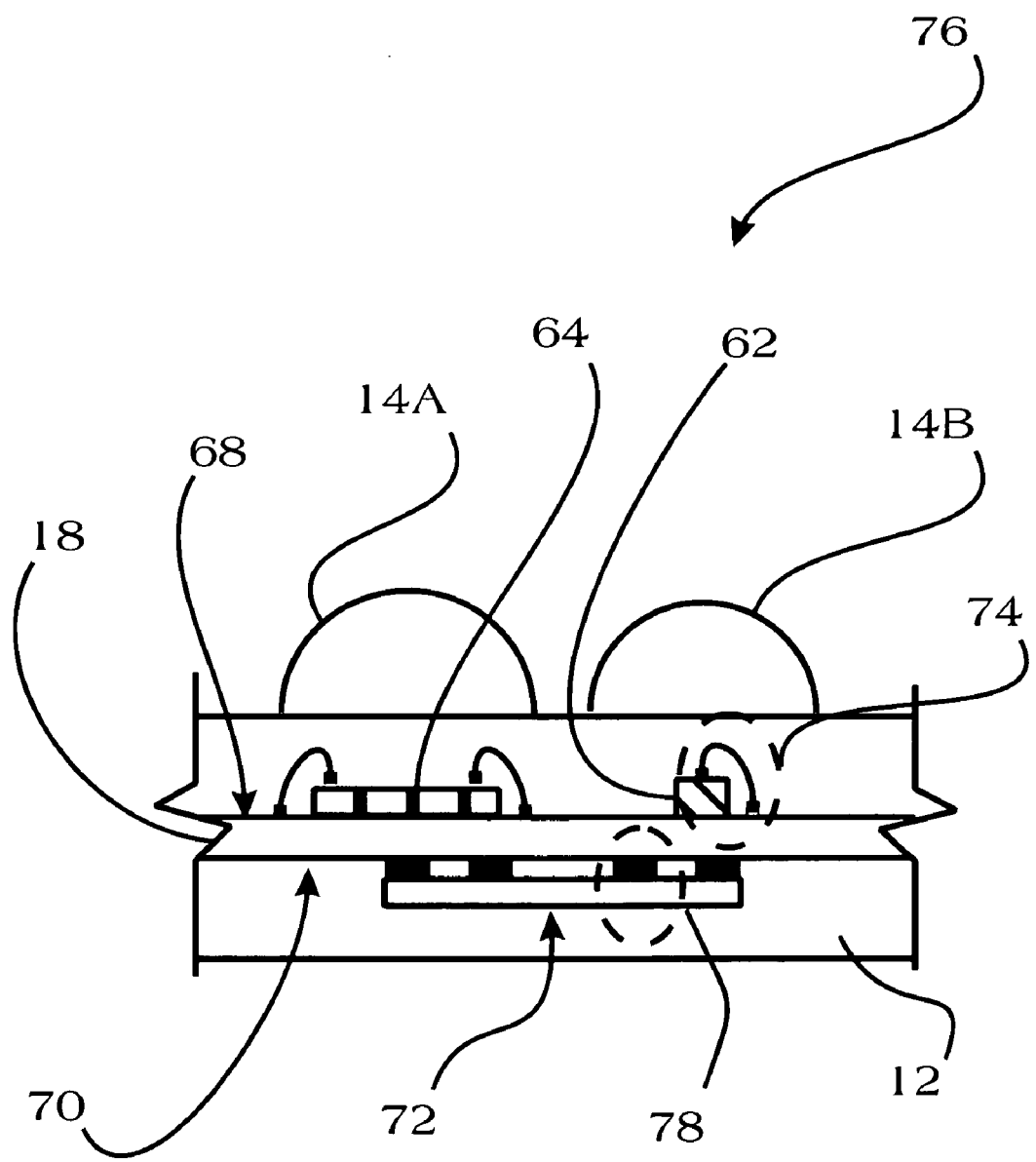
FIG. 10 is a cutaway top view of the improved infrared transceiver assembly of the present invention depicting a backside-mounted transceiver circuit device.

Now turning to FIG. 10, we can take a look at another embodiment of the present invention. FIG. 10 is a cutaway top view of the improved infrared transceiver assembly 76 of the present invention depicting a backside-mounted transceiver circuit device 72. Similar to FIG. 9, the device of FIG. 10 has a PC board 18 having a front side 68 and a backside 70. Also, this transceiver assembly 76 includes an infrared detection device lens element 14A and an infrared emitting device lens element 14B located to the front side 68 of the PC board 18 and electrically connected through connection means 74. What is unique about this present embodiment is that the transceiver circuit device 72 is actually located on the backside 70 of the PC board 18. In this case, the transceiver circuit device 72 is electrically connected to the PC board 18 via alternate connection means 78, which in this case comprises "bump" attachment (a common device soldering method). As can be seen from 10 the improved assembly 76 of FIG. 10, since the transceiver circuit device 72 is no longer located between the infrared detection device lens element 14A and the infrared emitting device lens element 14B, the width of PC board 18 and therefore the size of the housing 12 is much narrower, allowing the assembly 76 to be much smaller in size.

Figure 11:
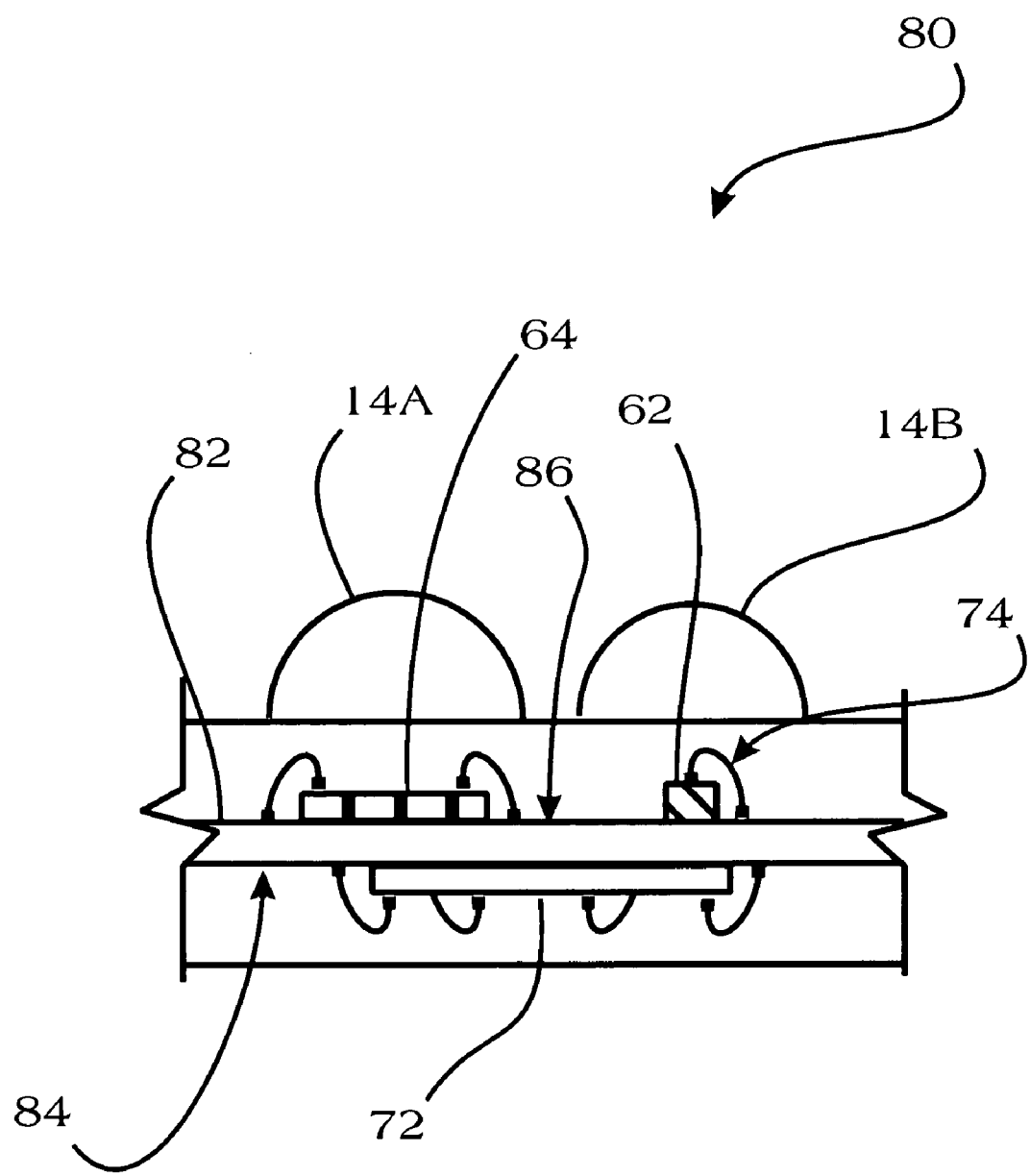
FIG. 11 is a cutaway top view of another improved infrared transceiver assembly depicting another backside-mounted transceiver circuit devices.

If we now turn to FIG. 11, we can see yet another embodiment of an improved infrared transceiver assembly 80. FIG. 11 is a cutaway top view of another improved infrared transceiver assembly depicting another backside-mounted transceiver circuit device 72. In FIG. 11, the base structure is a lead frame 82. A lead frame, like the PC board of the previous figures, is a common device mounting structure in the semi-conductor and electronics industry. The lead frame 82 has a back side 84 and a front side 86, just as with the PC board 18. In the transceiver assembly 80 of this preferred embodiment, the infrared detection device 64 and infrared emitting device 62 are both attached to the front side of the lead frame 86, however in this case, the transceiver circuit device 72 is attached to the backside of the lead frame 84, through the conventional connection means 74, comprising typical wire bond interconnection for electrical conductance. Just as with assembly 76 in FIG. 10, this embodiment 80 provides the advantage of a reduced package size, as well as providing at least two mounting and connection options for the transceiver circuit device 72.

Figure 12:
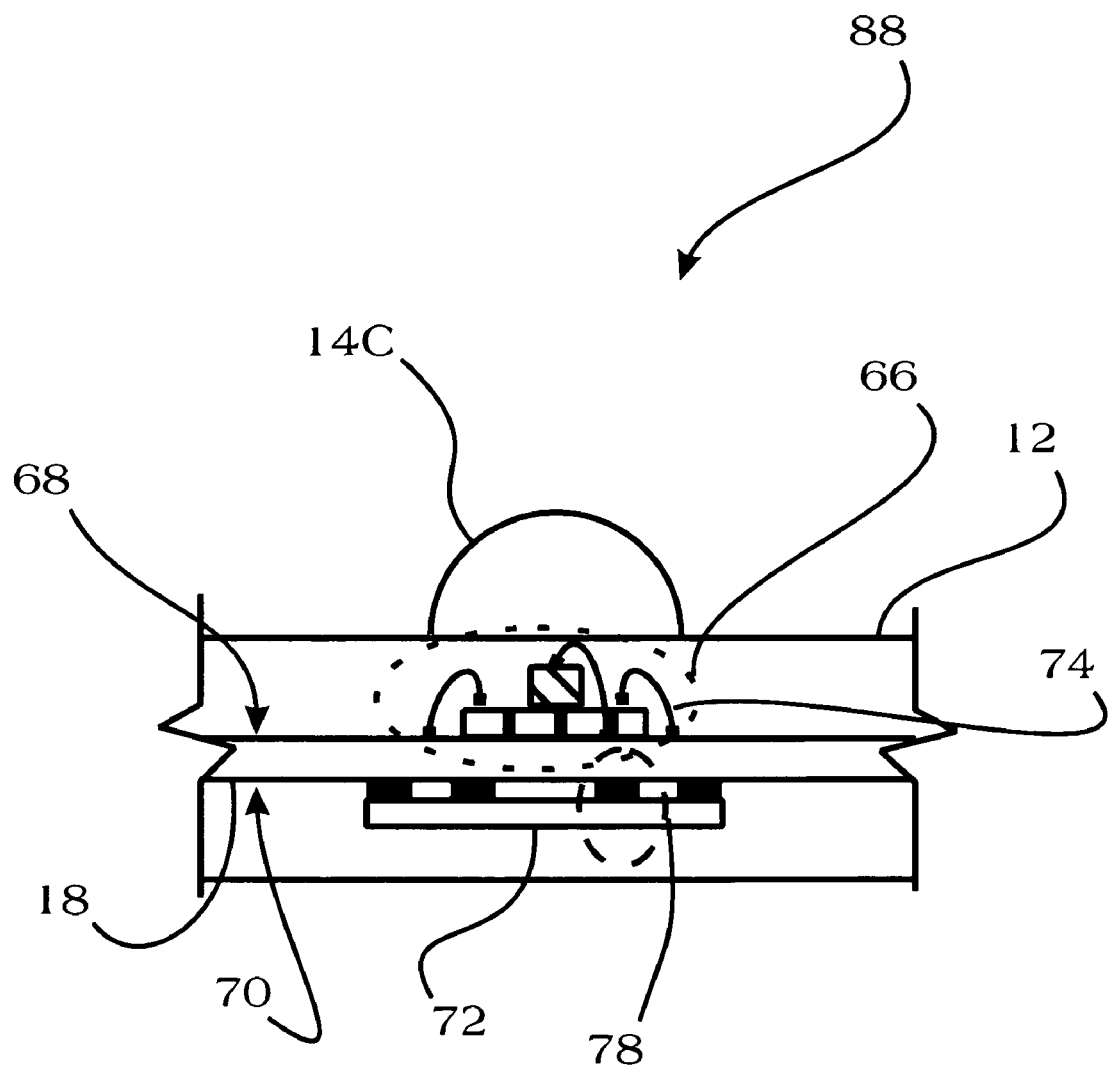
FIG. 12 is a cutaway top view of yet another improved infrared transceiver assembly depicting an integrated infrared emitting infrared detection device and a backside mounted transceiver circuit device.

FIG. 12 depicts yet another improved infrared transceiver assembly 88 of the present invention. FIG. 12 is a cutaway top view of yet another improved infrared transceiver assembly 88 depicting an integrated infrared emitting/infrared detection device stack 66 and a backside-mounted transceiver circuit device 72. In this embodiment, the integrated infrared 10 emitting/infrared detection device stack 66 is employed on the front side of the PC board 68 and connected thereto via connection means 74. Since the infrared emitting/infrared detection device stack 66 is integrated, the need for two lens elements is eliminated, resulting in a single primary lens element 14C. Furthermore, the transceiver circuit device 72 is attached to the backside of the PC board 70, just as described above in connection with FIG. 10. As can be appreciated, this preferred embodiment of the transceiver assembly 88 provides even further package size reduction over the previous units.

Figure 13:
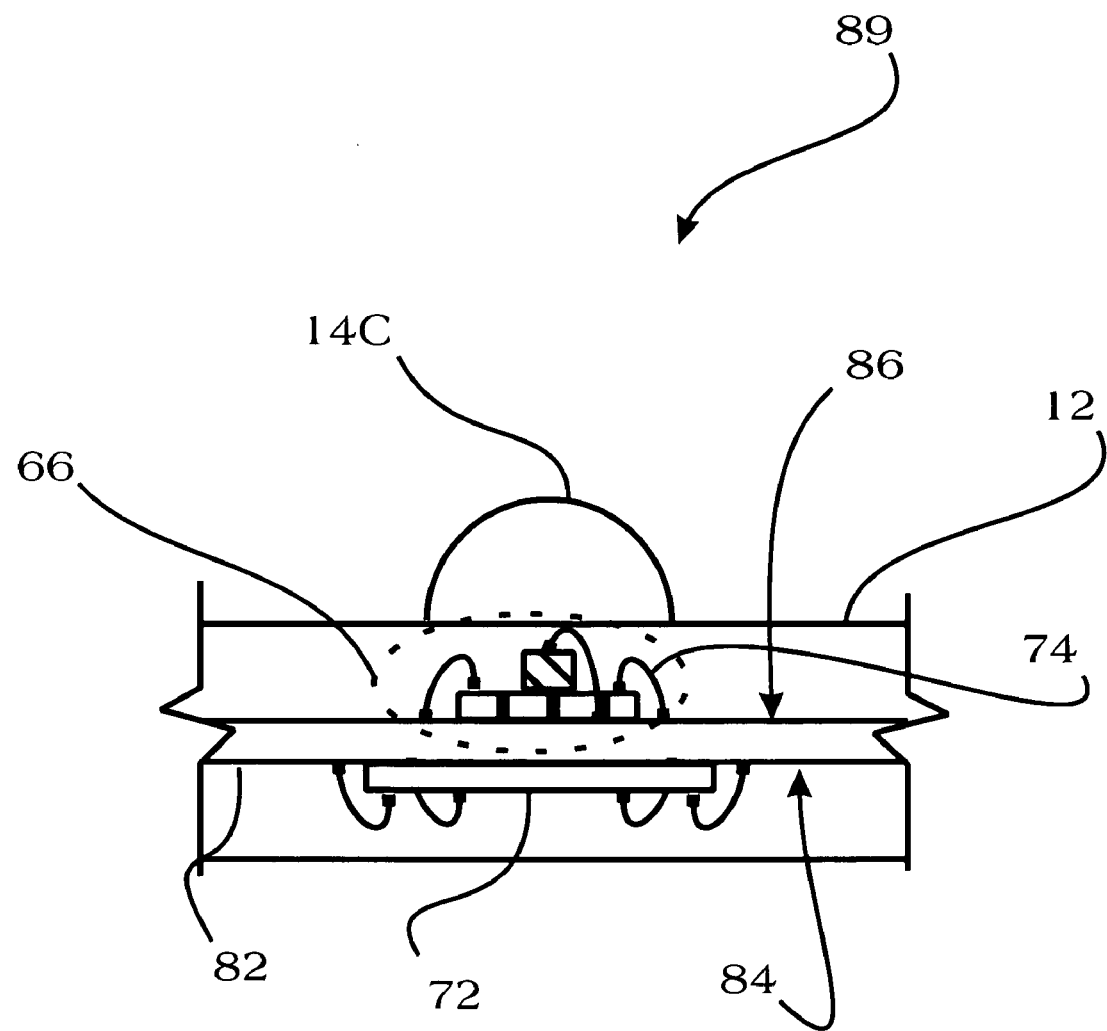
FIG. 13 is a cutaway top view of another improved infrared transceiver assembly also employing the integrated infrared emitting infrared detection device of the present invention and another example of a backside-mounted transceiver circuit device.

Similarly, FIG. 13 depicts the integrated infrared emitting/infrared detection device stack 66 attached to the lead frame's front side 86 with the transceiver circuit device 72 being attached to the backside of the lead frame 84. FIG. 13 is a cutaway top view of another improved infrared transceiver assembly 89 also employing the integrated infrared emitting/infrared detection device stack 66 of the present invention and another example of a backside-mounted transceiver circuit device 72. Again, like the assembly 88 of FIG. 12, this present embodiment of an improved infrared transceiver assembly 89 provides significant benefits in package size reduction.

Figure 14:
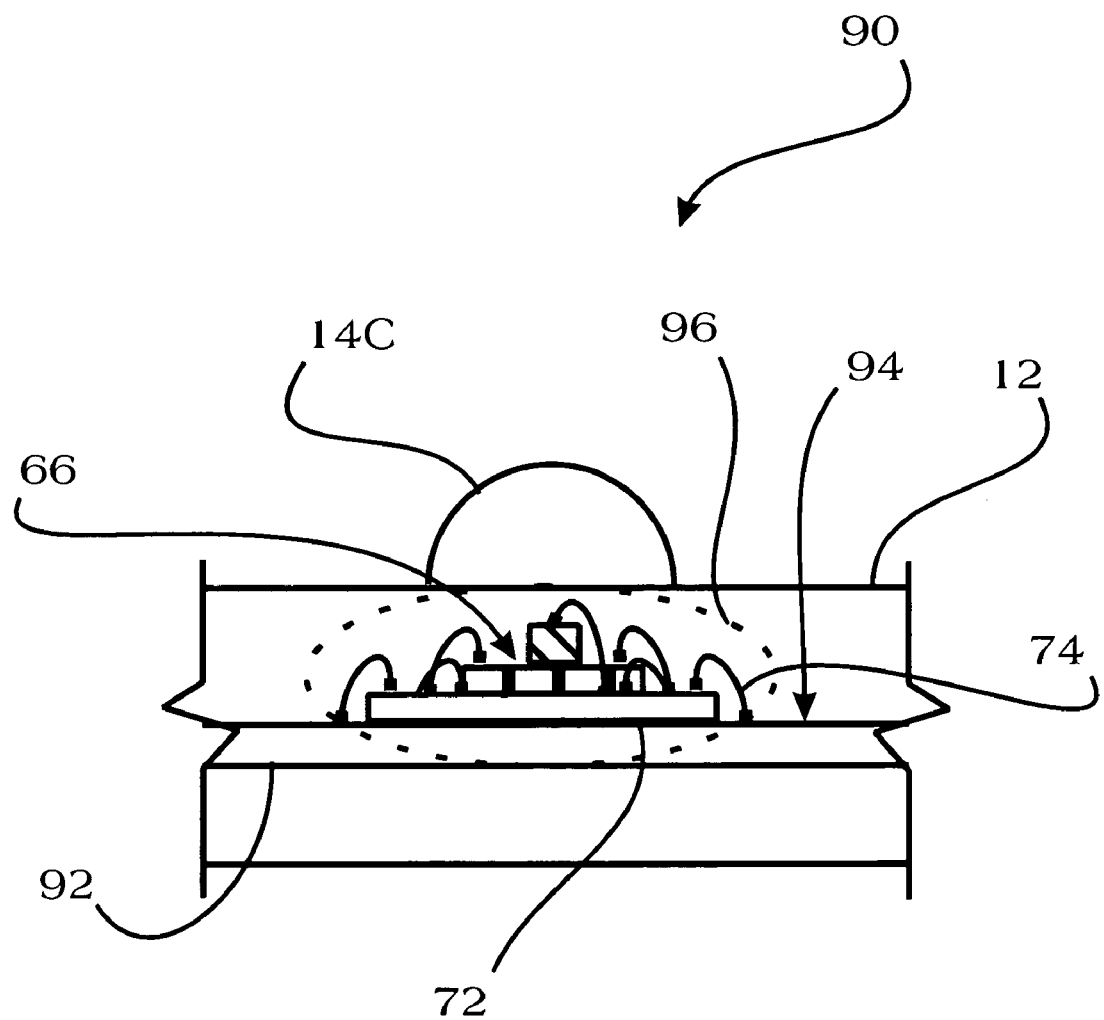
FIG. 14 is a cutaway top view of still another improved infrared transceiver assembly using a front side-mounted transceiver/infrared emitting infrared detection device stack.

Finally, we will turn to FIG. 14 to examine yet another preferred embodiment of an improved infrared transceiver assembly 90. FIG. 14 is a cutaway top view of still another improved infrared transceiver assembly 90 having a front side-mounted transceiver/infrared emitting/infrared detection device stack. This assembly 90 provides the smallest package size yet. In this case, the integrated infrared emitting/infrared detection device stack 66 and the transceiver circuit device 72 are stacked together in a transceiver/infrared emitting/infrared detection device stack 96. Since the infrared emitting/infrared detection device stack 66 and the transceiver circuit device 72 are stacked, all devices can be attached to the front side of the circuit structure 94. As can be appreciated, the circuit structure 92 might comprise a PC board or a lead frame or other conventional structural circuit-providing devices conventional in the art. It should be understood from this view that since all of the devices are attached to the front side of the circuit structure 94, the housing 12 is not only reduced in width, but is also thinner in depth than those improvements previously described in connection with FIGS. 10 through 13. In other embodiments, there might be multiple infrared emitting/infrared detection device stacks 66 spread out over the face of a single transceiver circuit device 72, which is then attached to the front side of the circuit structure 94. Furthermore, and as discussed previously in connection with FIGS. 3 through 8, while a single primary lens element 14C is shown here, this improved infrared transceiver assembly 90 might also include an embodiment where there is a primary lens element 14C as well as a secondary lens element 40. Still further, the embodiment is conceived where in a single device, the transceiver circuitry as well as the infrared emitting device and infrared detection device circuitry are combined such that a single set of connection means 74 attaches this integrated device to the circuit structure front side 94.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A transceiver system for sending and receiving infrared signals, comprising:

a circuit structure defined by a front side and a back side;

at least one infrared emitting device located on said front side;

at least one infrared detecting device also located on said front side;

a transceiver circuit device located on said front side, said infrared detecting device further comprising a front side and a back side, said infrared detecting device back side aligned to face said front side of said circuit structure, said infrared emitting device further comprising a back side, said infrared emitting device back side aligned to face said infrared detecting device front side, whereby said infrared emitting device and said infrared detection device form an integrated infrared emitting and infrared detection device, said integrated infrared emitting/infrared detection device is located on said front side of said transceiver circuit device to form a transceiver/infrared emitting/infrared detection device stack;

a primary lens element providing an optical path, said primary lens element and said transceiver/infrared emitting/infrared detection device stack cooperatively located such that said transceiver/infrared emitting/infrared detection device stack is aligned with said optical path; and a secondary lens unit separated by a distance from said primary lens element and aligned along said optical path, the primary lens element located between the secondary lens unit and the at least one infrared emitting device, the secondary lens unit causing a ray to be refracted such that the angle of the ray with respect to the secondary lens unit is modified by passing through the secondary lens unit.

2. The system of claim 1, further comprising:
a housing encapsulating said transceiver/infrared emitting/infrared detection device stack.

3. An improved process for transmitting and receiving infrared signals from an infrared transceiver assembly comprising a circuit structure defining a first side and a second side, a transceiver circuit device, at least one infrared emitting device and at least one infrared detection device, the steps comprising:
transmitting infrared signals by transmitting signals to said transceiver circuit device, said transceiver circuit device being located on said first side;
passing said signals through said transceiver circuit device and to said infrared emitting device, said infrared emitting device located on said second side;
emitting infrared signals from said infrared emitting device;
receiving infrared signals by receiving infrared signals with said infrared detection device, said infrared emitting device being stacked upon said infrared detection device to form an integrated infrared emitting/detection device stack;
passing said received signals to said transceiver circuit device; and
passing said received signals away from said transceiver circuit device.

4. The process of claim 3, wherein said first passing comprises passing said signals to said infrared emitting device via said circuit structure, said circuit structure comprising a printed circuit board, and wherein said second passing comprises passing said received signals to said transceiver circuit device via said circuit structure.

5. An optical communication device for transmitting and receiving optical communication signals, comprising:
an optical receiving device that receives a first optical signal at a first surface;
an optical transmission device that emits a second optical signal from a second surface, the first and second surfaces facing in a common direction;
a support element, the optical receiving device and the optical transmission device mounted to a first side of the support element; and
a transceiver device in communication with both the optical transmission device and the optical receiving device, the transceiver device mounted on a second side of the support element, the second side in opposition to the first side.

6. The optical communication device of claim 5, wherein the support element is a printed circuit board.

7. The optical communication device of claim 5, wherein the optical receiving device and the optical transmission device are both directly mounted to the first side of the support element and are spaced apart along the first side of the support element.

8. The optical communication device of claim 5, wherein the optical transmission device is mounted on the optical receiving device, and the optical receiving device is mounted on the first side of the support element.

9. The optical communication device of claim 5, wherein the transceiver device has a circuit on a third surface, the third surface facing the second side of the support element.

10. The optical communication device of claim 5, wherein the transceiver device has a circuit on a third surface, the third surface facing away from the second side of the support element.

11. The optical communication device of claim 5, further comprising:
a transmission lens that passes a ray from the optical transmission device.

12. The optical communication device of claim 5, further comprising:
a receiving lens that passes a ray to the optical receiving device.

13. The optical communication device of claim 5, further comprising:
a single lens that passes a first ray from the optical transmission device and passes a second ray to the optical receiving device.

14. A transceiver system for sending and receiving infrared signals, comprising:
a circuit structure having a front side;
an infrared emitting device having a back side;
an infrared detection device having a front side and a back side;
a transceiver circuit device having a front side and a back side, said infrared detecting device back side aligned to face said front side of said transceiver circuit device, said infrared emitting device back side aligned to face said infrared detection device front side, wherein said infrared emitting device and said infrared detection device form an integrated infrared emitting/infrared detection device, said integrated infrared emitting/infrared detection device located on said front side of said transceiver circuit device to form a transceiver/infrared emitting/infrared detection device stack located on said front side of said circuit structure;
a primary lens element, said primary lens element and said transceiver/infrared emitting/infrared detection device stack being oriented such that an optical path originating from said infrared emitting device passes through said primary lens element, wherein a ray travels from said infrared emitting device along said optical path; and
a secondary lens element separated by a distance from said primary lens element and aligned along said optical path, said primary lens element located between said secondary lens element and said infrared emitting device, said secondary lens element causing said ray to be refracted such that an angle of said ray with respect to said secondary lens element is modified by passing through said secondary lens element.

15. The transceiver system of claim 14, wherein said primary lens element and said transceiver/infrared emitting/infrared detection device stack are oriented such that said optical path from said infrared emitting device is reflected by a mirror and then passes through said primary lens element.

16. The transceiver system of claim 14, wherein said primary lens element comprises a different refractive power than that of said secondary lens element.

17. The transceiver system of claim 14, wherein said primary lens element has no refractive power.

18. The transceiver system of claim 14, wherein said secondary lens element exhibits a plurality of different refractive powers.

19. The transceiver system of claim 18, wherein said secondary lens element comprises a separate region for each of said plurality of different refractive powers.

20. The transceiver system of claim 19, wherein each of said separate regions comprises a single refractive power.

21. The transceiver system of claim 14, further comprising:
a housing encapsulating said transceiver/infrared emitting/infrared detection device stack, said housing comprising a wall at least partially defined by said primary lens element.

22. The transceiver system of claim 21, wherein said wall has an outer surface that is substantially flat.

* * * * *